United States Patent
Lehto

(10) Patent No.: US 6,867,649 B2
(45) Date of Patent: Mar. 15, 2005

(54) COMMON-MODE AND DIFFERENTIAL-MODE COMPENSATION FOR OPERATIONAL AMPLIFIER CIRCUITS

(75) Inventor: Jeffrey S. Lehto, San Jose, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 0 days.

(21) Appl. No.: 10/657,447

(22) Filed: Sep. 8, 2003

(65) Prior Publication Data

US 2004/0056715 A1 Mar. 25, 2004

Related U.S. Application Data

(60) Provisional application No. 60/413,896, filed on Sep. 25, 2002.

(51) Int. Cl.[7] ................................................ H03F 3/45
(52) U.S. Cl. ...................................... 330/252; 330/258
(58) Field of Search ................................ 330/252, 253, 330/255, 257, 258, 260, 261; 327/359

(56) References Cited

U.S. PATENT DOCUMENTS 5,266,852 A * 11/1993 Shigenari et al. ........... 327/552
5,374,897 A * 12/1994 Moraveji .................... 330/252
5,420,542 A * 5/1995 Harvey ....................... 330/292

* cited by examiner

Primary Examiner—Henry Choe
(74) Attorney, Agent, or Firm—Fliesler Meyer LLP

(57) ABSTRACT

An amplifier is configured to provide both common-mode and differential-mode compensation to ensure stability in telecommunications circuits or other circuits where both common mode and differential mode signal paths are provided. The amplifier includes two interconnected operational amplifiers $AMP_A$ and $AMP_B$. Common mode compensation is provided by connecting one or more capacitors with a total value $C_{COMMON}$ connected from a gain node at the input of an inverter in one of the amplifiers $AMP_A$ or $AMP_B$ to the output of the inverter in the other amplifier. Differential mode compensation can be provided by connecting a capacitor with value $C_{COMP}$ at the gain node of each of the amplifiers $AMP_A$ or $AMP_B$. Alternatively, both differential mode and Miller effect compensation can be provided by connecting one or more capacitors with total value $C_{COMP}$ from the input to the output of components forming the inverter in each of the amplifiers $AMP_A$ and $AMP_B$. As a further alternative, differential mode compensation can is provided independent of common mode compensation by connecting a capacitor with value $C_{DIFF}$ between the outputs of the inverters of the amplifiers $AMP_A$ and $AMP_B$.

11 Claims, 8 Drawing Sheets

COMMON-MODE AND DIFFERENTIAL-MODE COMPENSATION FOR OPERATIONAL AMPLIFIER CIRCUITS

PRIORITY CLAIM

The present application claims priority under 35 U.S.C. 119(e) to U.S. Provisional Patent Application No. 60/413,896, entitled "Common-Mode and Differential-Mode Compensation for Operational Amplifier Circuits," which was filed on Sep. 25, 2002.

FIELD OF THE INVENTION

The present invention relates to frequency compensation provided for operational amplifiers connected to provide two different signal paths, one for common-mode signals and another for differential mode signals.

BACKGROUND

Operational amplifiers are prone to instability and, thus, require some means of frequency compensation to ensure reliable stable operation. FIG. 1 shows a commonly used compensation technique used in an operational amplifier 100. The amplifier 100 includes a transconductance stage 102, a compensation capacitor ($C_{COMP}$) 104 and high-impedance resistor ($R_{HI}$) 106 connected to the gain node n105, and a buffer 108 connecting the gain node to the amplifier output.

The compensation technique used in FIG. 1 includes placing the compensation capacitor 104 at the high-impedance gain node n105 to reduce the amplifier gain at high frequency, thus introduces a dominant pole into the open-loop frequency response of the operational amplifier 100. The dominant pole then occurs at a frequency $f_p$ calculated as follows:

$$f_p = 1/(2\pi R_{HI} C_{COMP})$$

The minimum value of compensation capacitor ($C_{COMP}$) required to guarantee stable operation depends on many factors, including external feedback and the load impedance at the amplifier's output.

Often two of the operational amplifiers 100, as shown in FIG. 1, will be interconnected to form a differential driver circuit, which contains both a differential and a common-mode signal path. An example of two such interconnected amplifiers 200 and 202 is shown in FIG. 2. In FIG. 2, a common mode signal is applied by voltage source ($V_{CM}$) 220 to the non-inverting inputs of amplifiers $AMP_A$ 200 and $AMP_B$ 202, while a differential mode signal is supplied by voltage sources 232 and 230. Any arbitrary voltage input to the circuit in FIG. 2 can be represented as a sum of common-mode and differential input voltages. Feedback resistors 204 and 206, each having a resistance value $R_F$, are connected between the output of amplifiers 200 and 202 and their inverting inputs. A gain resistor 208, having a resistance $2R_G$, is further connected between the inverting inputs. A load impedance having the resistance $R_L$ is connected between the outputs $OUT_A$ and $OUT_B$ of the respective amplifiers $AMP_A$ 200 and $AMP_B$ 202.

To illustrate why the compensation scheme of FIG. 1 is not optimal for the circuit of FIG. 2, consider the effect of the two independent signal paths on stability. Common-mode signals will not cause any current to flow through the gain resistor 208 and load resistor 210, and therefore the common-mode and differential signal paths will have different voltage/current feedback levels and load impedances. The differential output voltage $V_{OD}$ and the common-mode output voltage $V_{OC}$ are given as follows:

$$V_{OD} = V_{DIFF}(1 + R_F/R_G)$$

$$V_{OC} = V_{CM}$$

Therefore the common-mode signal path has a gain of unity and its output is unloaded, while the differential signal path has a higher gain and sees a resistive load.

Because of these differences the two signal paths will have different minimum values of $C_{COMP}$ required to ensure stable operation. To guarantee stable operation of the entire circuit, the larger of these two values must be used. If, for example, the common-mode signal path requires a higher value of $C_{COMP}$, then the differential signal path will be "over-compensated", thus lowering signal bandwidths and slew rates and limiting overall amplifier performance.

One circuit modification to partially avoid this problem would be to replace the gain resistor 208 of FIG. 2 with the resistors 300 and 302 of FIG. 3 which connect the inverting inputs of amplifiers 200 and 202 to ground. With such a circuit both differential and common-mode signals cause current to flow through $R_G$. Therefore both signal paths see the same feedback levels and have the same closed-loop gain, and will require roughly the same value of $C_{COMP}$. However, the load impedance is still different for the two signal paths and some over-compensation is unavoidable. Additionally, the connection to ground in the circuit of FIG. 3 has several undesirable properties. Common-mode offset and noise voltages will be fully amplified, and because the two amplifiers are now isolated their output voltages and currents will not necessarily track each other. These effects will compromise differential signal performance.

SUMMARY

In accordance with the present invention, a compensation scheme is provided for two interconnected amplifier circuits which allows independent frequency compensation of the common-mode and/or differential signal paths. This method can be used to stabilize differential circuits without compromising performance through over-compensation, and without any need to isolate the amplifiers from one another.

A circuit in accordance with an embodiment of the present invention includes two operational amplifier amplifiers $AMP_A$ and $AMP_B$. The amplifiers making up $AMP_A$ and $AMP_B$ can use any operational amplifier topology including voltage feedback and current feedback methods, and can be made from any transistor technology including, but not limited to, bipolar and MOSFET devices. The amplifiers $AMP_A$ and $AMP_B$ each include a transconductance stage and output buffer, similar to FIG. 1. Circuitry is further included in each of $AMP_A$ and $AMP_B$ to form an inverter, with the inverter having an input connected to the gain node at the output of the transconductance stage.

Common mode compensation is provided by connecting capacitors from the gain node at the input of an inverter in one of the amplifiers $AMP_A$ or $AMP_B$ to the output of the inverter in the other amplifier. For the bipolar current feedback amplifiers, two capacitors having a value $C_{COMMON}/2$ are connected together in each of $AMP_A$ and $AMP_B$ on one end to the output of current mirrors which are connected to effectively form the output of the inverter, and separately to separate inputs of the current mirrors in the opposing $AMP_A$ or $AMP_B$. For the MOSFET differential amplifiers, common mode compensation capacitors having a value $C_{COMMON}$ are connected from the inverting output of one differential amplifier to the non-inverting output of the other differential amplifier.

Differential mode compensation can be provided by connecting a capacitor with value $C_{COMP}$ from the gain node to ground of each of the amplifiers $AMP_A$ or $AMP_B$, similar to the compensation provided in amplifier 100 of FIG. 1. Alternatively, both differential mode and Miller effect compensation can be provided by connecting capacitors from the input to the output of components forming the inverter in each of the amplifiers $AMP_A$ and $AMP_B$. For the MOSFET differential amplifiers, differential and Miller effect compensation is provided by connecting a capacitor having a value $C_{COMP}$ between the inverting and non-inverting outputs in each amplifier. For bipolar current feedback amplifiers, a capacitance of $C_{COMP/2}$ is connected between the output of current mirrors forming the gain node, and each current mirror input. As a further alternative, differential and common mode compensation can be provided independently by connecting a capacitor with value $C_{DIFF}$ between the outputs of the inverters of the amplifiers $AMP_A$ and $AMP_B$.

BRIEF DESCRIPTION OF THE DRAWINGS

The present invention will be described with respect to particular embodiments, and references will be made to the drawings in which.

DETAILED DESCRIPTION

Figure 4:
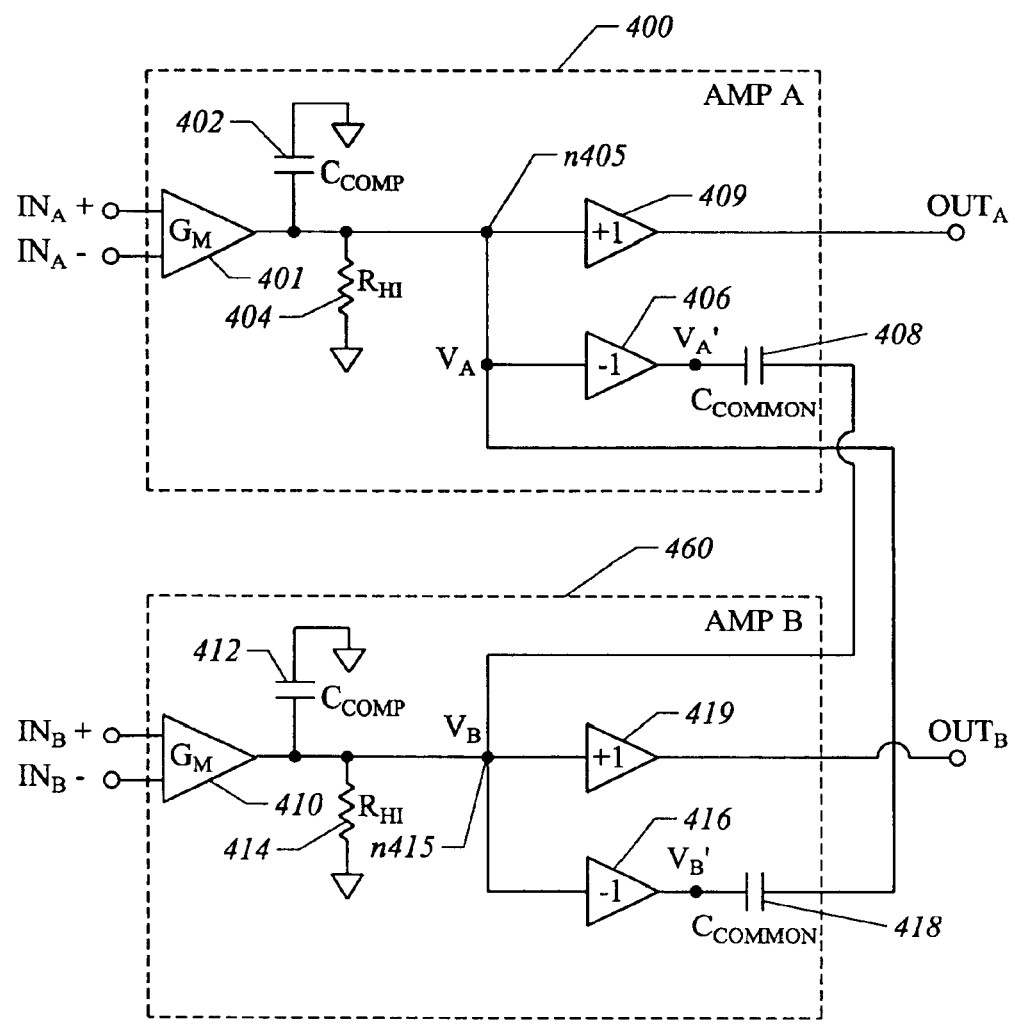
FIG. 4 shows an operational amplifier using a compensation technique in accordance with an embodiment of the present invention.

FIG. 4 shows an operational amplifier using a compensation technique in accordance with embodiments of the present invention. The circuit of FIG. 4 includes two amplifiers, $AMP_A$ 400 and $AMP_B$ 460. The amplifier $AMP_A$ 400 includes a transconductance amplifier 401, high impedance node resistor 404, compensation capacitor 402, and output buffer 409, similar to the components of FIG. 1. Similarly, amplifier $AMP_B$ 460 includes a transconductance amplifier 410, high impedance node resistor 414, compensation capacitor 412, and output buffer 419, as in FIG. 1.

Figure 1:
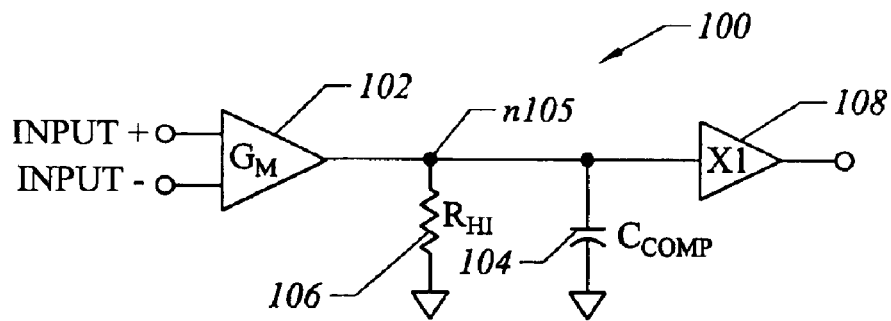
FIG. 1 shows a commonly used compensation technique for an operational amplifier.
Figure 2:
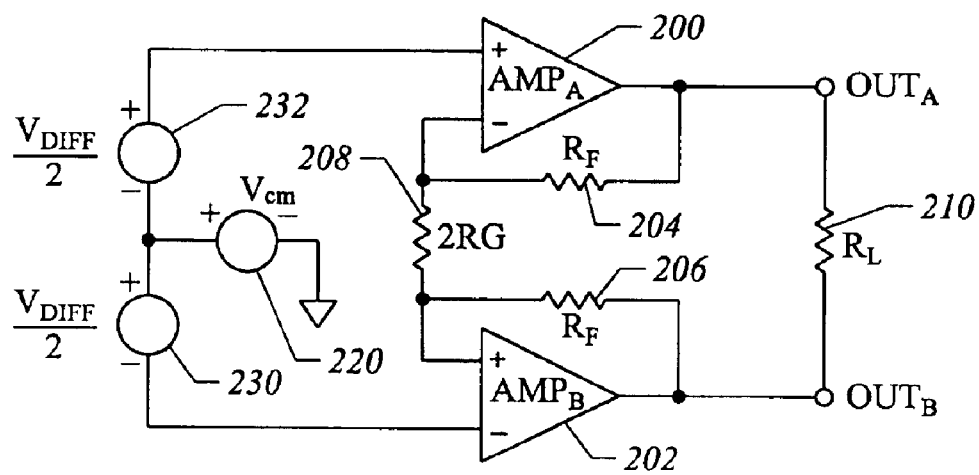
FIG. 2 shows two of the operational amplifiers of FIG. 1 interconnected to drive both a differential signal and a common mode signal.
Figure 3:
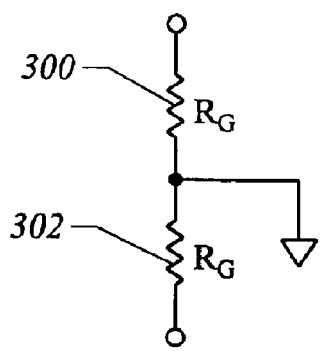
FIG. 3 shows gain resistors which may be used to replace the gain resistor of FIG. 2.

Unlike the components of FIG. 1, the amplifier $AMP_A$ 400 further includes an inverter 406 and common mode compensation capacitor $C_{COMMON}$ 408 connected in series. The input of the inverter 406 is connected to the gain node n405 of the amplifier $AMP_A$ 400, and the output of the capacitor $C_{COMMON}$ 408 is connected to the gain node n415 of the amplifier $AMP_B$ 460. Similarly, the amplifier $AMP_B$ 460 includes an inverter 416 and common mode compensation capacitor $C_{COMMON}$ 418 connected in series. The input of the inverter 416 is connected to the gain node n415 of the amplifier $AMP_B$ 460, and the output of the capacitor $C_{COMMON}$ 418 is connected to the gain node n405 of the amplifier $AMP_A$ 400.

In operation, it is first assumed that a differential input signal is applied, so any signal at the input of amplifier $AMP_A$ 400 is the opposite in sign to the input signal of amplifier $AMP_B$ 460. $V_A$ is defined as the voltage at the gain node n405, $V_B$ is the voltage at gain node n415, $V'_A$ is the voltage at the output of inverter 406, and $V'_B$ being the voltage at the output of inverter. The following relations then exist:

$$V_A = -V_B$$

$$V'_A = -V_A = V_B$$

$$V'_B = -V_B = V_A$$

$$V'_A - V_B = V'_B - V_A = 0$$

Therefore in the case of the differential input signal, the voltages across the capacitors $C_{COMMON}$ 408 and $C_{COMMON}$ 418 are equal to zero. These two capacitors thus have no effect on differential signals, and the effective differential compensation capacitance is equal to $C_{COMP}$, as was the case in FIG. 1:

$$C_{EFF,DIFF} = C_{COMP}$$

In contrast, for the case of a common-mode signal, it is assumed that any signal at the input of amplifier $AMP_A$ 400 is equal to the input signal of amplifier $AMP_B$ 460. Using the voltage definitions from the previous passage, the relevant relations are now as follows:

$$V_A = V_B$$

$$V'_A = -V_A = -V_B$$

$$V'_B = -V_B = V_A$$

$$V'_A - V_B = V'_B - V_A = 2V_A = 2V_B$$

With these relations, the voltage across the capacitor $C_{COMMON}$ 408 ($V'_A - V_B = 2V_A$) will be twice the voltage difference across the capacitor $C_{COMP}$ 404 ($V_A$). Similarly, the voltage across the capacitor $C_{COMMON}$ 418 ($V'_B - V_A = 2V_B$) will be twice the voltage difference across the capacitor $C_{COMP}$ ($V_B$). Thus, the total effective common-mode compensation capacitance provided at either node n405 or n415, $C_{EFF,CM}$, is:

$$C_{EFF,CM} = C_{COMP} + 2C_{COMMON}$$

Therefore, with $C_{COMP}$ compensating for differential mode and $C_{COMMON}$ compensating for the common mode, the common mode and the differential mode are both compensated, and common mode instabilities can be mitigated without compromising differential mode performance.

Figure 5:
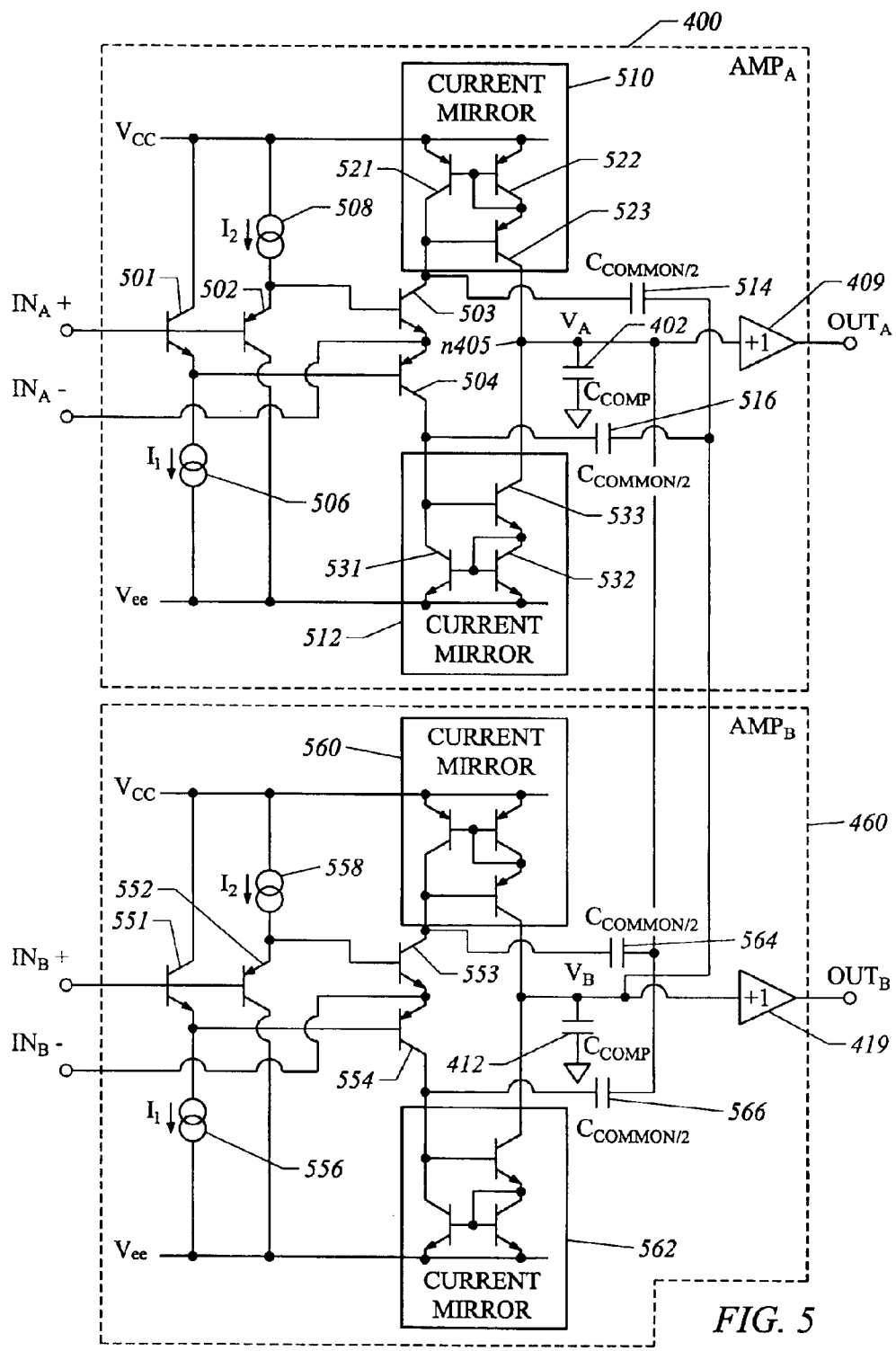
FIG. 5 shows circuitry implementing the block diagram of FIG. 4 using bipolar current-feedback amplifiers, according to an embodiment of the present invention.

Implementation of the block diagram of FIG. 4 using bipolar current-feedback amplifiers is shown in FIG. 5. As in FIG. 4, the operational amplifier of FIG. 5 includes an $AMP_A$ 400 and an $AMP_B$ 460. For convenience, components carried over from FIG. 4 to FIG. 5 are similarly labeled, as will be components carried over in subsequent drawings.

The current feedback amplifier of $AMP_A$ 400 includes an NPN transistor 501 and a PNP transistor 502 having common bases forming the non-inverting input of the amplifier $AMP_A$ 400. The transistor 501 has a collector connected to a power supply rail Vcc, and an emitter connected by a current sink 506 to a power supply rail Vee. The transistor 501 has its emitter connected through a current sink 508 to the power supply rail Vcc, and its collector connected to the power supply rail Vee. The emitter of transistor 502 is further connected to the base of NPN transistor 503, while the emitter of transistor 501 is connected to the base of PNP transistor 504. Transistors 503 and 504 are connected in an emitter follower configuration with the collector of transistor 503 connected to an input terminal of current mirror 510, and the collector of transistor 504 connected to an input terminal of current mirror 512. The outputs of the current mirrors 510 and 512 are connected to form the gain node n405. The gain node n405 is connected through buffer 409 to form the output OUT$_A$ of the amplifier AMP$_A$ 400.

The current mirror 510 includes PNP transistors 521 and 522 having common bases, and emitters connected to the voltage supply rail Vcc. The collector of transistor 521 forms the current mirror input connected to transistor 503. The collector of transistor 522 is connected to its base, as well as to the emitter of transistor 523. Transistor 523 has a base connected to the collector of transistor 521 and a collector forming an output of the current mirror 510. The current mirror 512 includes transistors 531 and 532 connected in a common base configuration, similar to transistors 521 and 522 of current mirror 510. Transistor 533 in current mirror 512 is connected similar to transistor 523. The outputs of the current mirrors 510 and 512 at the collectors of transistors 523 and 533, effectively form the inverter 406 of FIG. 4. The transistors 523 and 533 function to reduce the effect of variations of the voltage rails Vcc and Vee. Although a particular configuration is shown for current mirrors 510 and 512, other configurations could be used, such as by removing transistors 523 and 533 and connecting the collectors of transistors 522 and 532 directly to the gain node.

To provide for differential mode compensation, capacitor C$_{COMP}$ 402 is connected to the gain node n405. The collectors of transistors 523 and 533 provide a high impedance, eliminating the need for the resistors R$_{HI}$ 404 and 414 of FIG. 4. To provide for common mode compensation, capacitors 514 and 516 with a value C$_{COMMON}$/2 are connected together on one end, and to the collector of the respective transistors 503 and 504 at the other end.

The current feedback amplifier further includes AMP$_B$ 460 made up of NPN transistor 551 and PNP transistor 552 having common bases forming the non-inverting input of the amplifier AMP$_B$ 460, similar to transistors 501 and 502 of AMP$_A$ 400. The transistors 551 and 552 are connected by respective current sinks 556 and 558 to the power supply rails Vcc and Vee. The amplifier AMP$_B$ 460 further includes emitter follower transistors 553 and 554 connected to current mirrors 560 and 562, similar to the emitter follower transistors 503 and 504 connected to current mirrors 510 and 512 of AMP$_A$ 400. The outputs of the current mirrors 560 and 562 form the gain node n415 for AMP$_B$ 460. The current mirrors 560 and 562 have components similar to current mirrors 510 and 512 of AMP$_A$ 400. The gain node n415 is connected by a buffer 419 to form the amplifier output OUT$_B$.

To provide compensation, a differential mode capacitor 412 having a value C$_{COMP}$ is connected from the gain node n415 to ground. Common mode compensation capacitors 564 and 566 with values C$_{COMMON/2}$ have first ends connected to the collectors of respective transistors 553 and 554, and second ends connected together to the gain node n405 of AMP$_A$ 400. The connected terminals of the common mode compensation capacitors 514 and 516 of AMP$_A$ 400 are likewise connected to the gain node n415 of AMP$_B$ 460.

In the circuit of FIG. 5 the current mirrors are playing a dual role, being both part of the transconductance stage and also providing voltage inversion. For example, in current mirror 510 voltage inversion is obtained between the collectors of transistors 521 and 523. This voltage inversion plays the role of voltage inverters 406 and 416 in FIG. 4, and the effective differential and common-mode compensation can be calculated as above. Similar comments apply to the current mirrors in the remaining figures.

Figure 6:
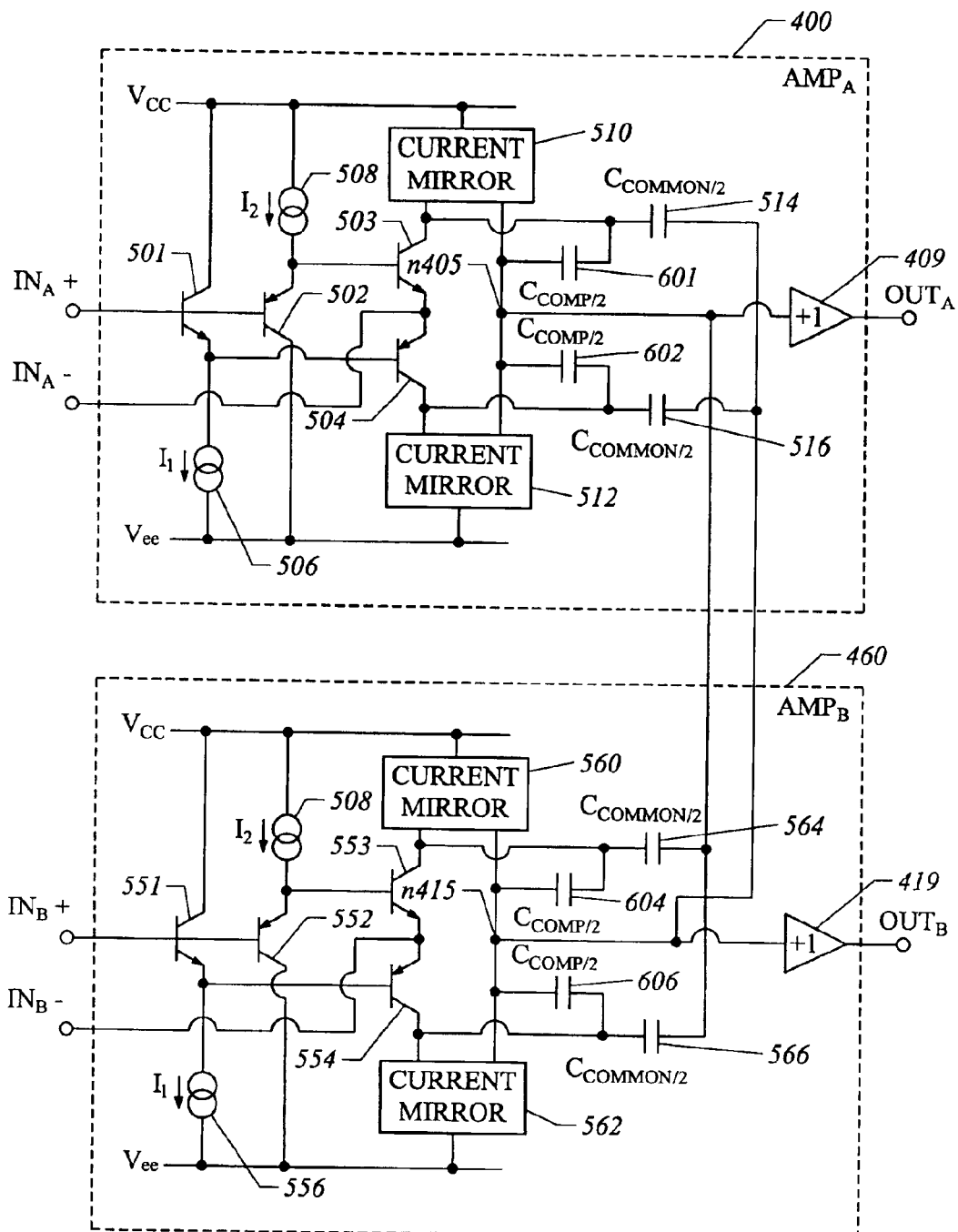
FIG. 6 shows modifications to the circuit of FIG. 5 to provide Miller effect compensation, according to an embodiment of the present invention.

FIG. 6 shows modifications to the circuit of FIG. 5 to provide Miller effect compensation. FIG. 6 removes the differential mode compensation capacitors 402 and 412, having a value C$_{COMP}$, from FIG. 5. Capacitor 402 is replaced with capacitors 601 and 602, each having a value C$_{COMP/2}$. Capacitor 412 is replaced with capacitors 604 and 606, each having the value C$_{COMP/2}$. Capacitors 601 and 602 are connected on a first terminal to the gain node n405, and on a second terminal to the collector of respective transistors 503 and 504. Capacitors 604 and 606 are connected on a first terminal to the gain node n415, and on a second terminal to the collector of respective transistors 553 and 554. Apart from providing Miller effect compensation, the circuit of FIG. 6 functions in a substantially similar manner to the circuit of FIG. 5.

Figure 7:
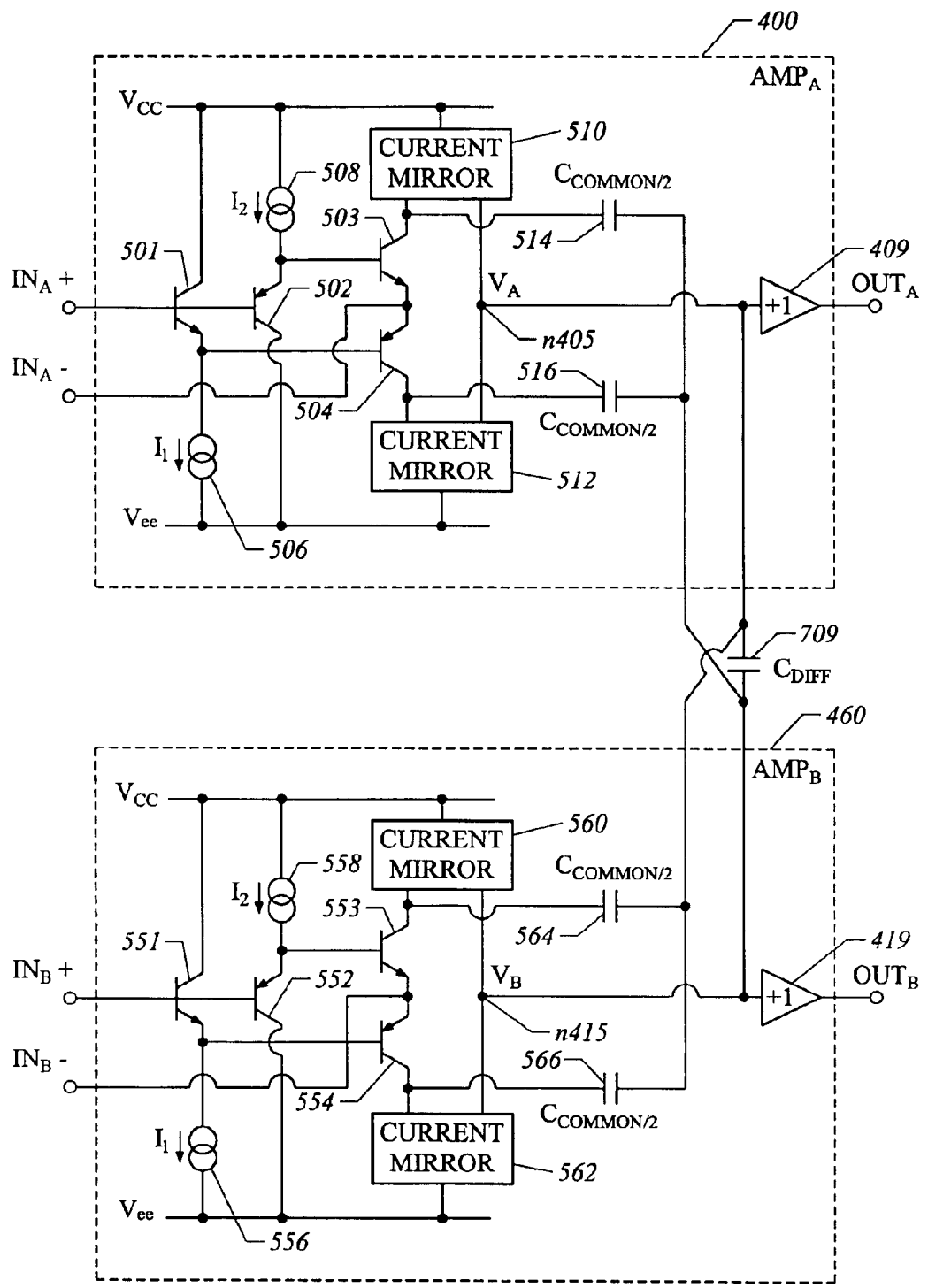
FIG. 7 shows modifications to FIG. 5 to enable common-mode signals and differential mode signals to be independently compensated, according to an embodiment of the present invention.

FIG. 7 shows modifications to FIG. 5 to enable common-mode signals and differential mode signals to be independently compensated. In FIG. 7, the compensation capacitors 402 and 412, having a value C$_{COMP}$, from FIG. 5 are replaced by a single compensation capacitor 709 having a value C$_{DIFF}$. The capacitor 709 is connected between the gain nodes n405 and n415 of the amplifiers AMP$_A$ 400 and AMP$_B$ 460. In operation with only common mode signals, the capacitor 709 with value C$_{DIFF}$ would see no voltage difference across its terminals, but for only differential mode signals, the capacitor 709 would see twice the differential voltage across its terminals. Similarly, the common mode capacitors 514, 516, 564 and 566, each with a value C$_{COMMON/2}$, would see no voltage difference across their terminals for differential mode signals, but would see twice the common mode voltage. Accordingly, the equivalent common mode and differential mode capacitance compensation values can be independently specified as follows:

$$C_{COMP-DM}=2C_{DIFF}$$

$$C_{COMP-CM}=2C_{COMMON}$$

Figure 8:
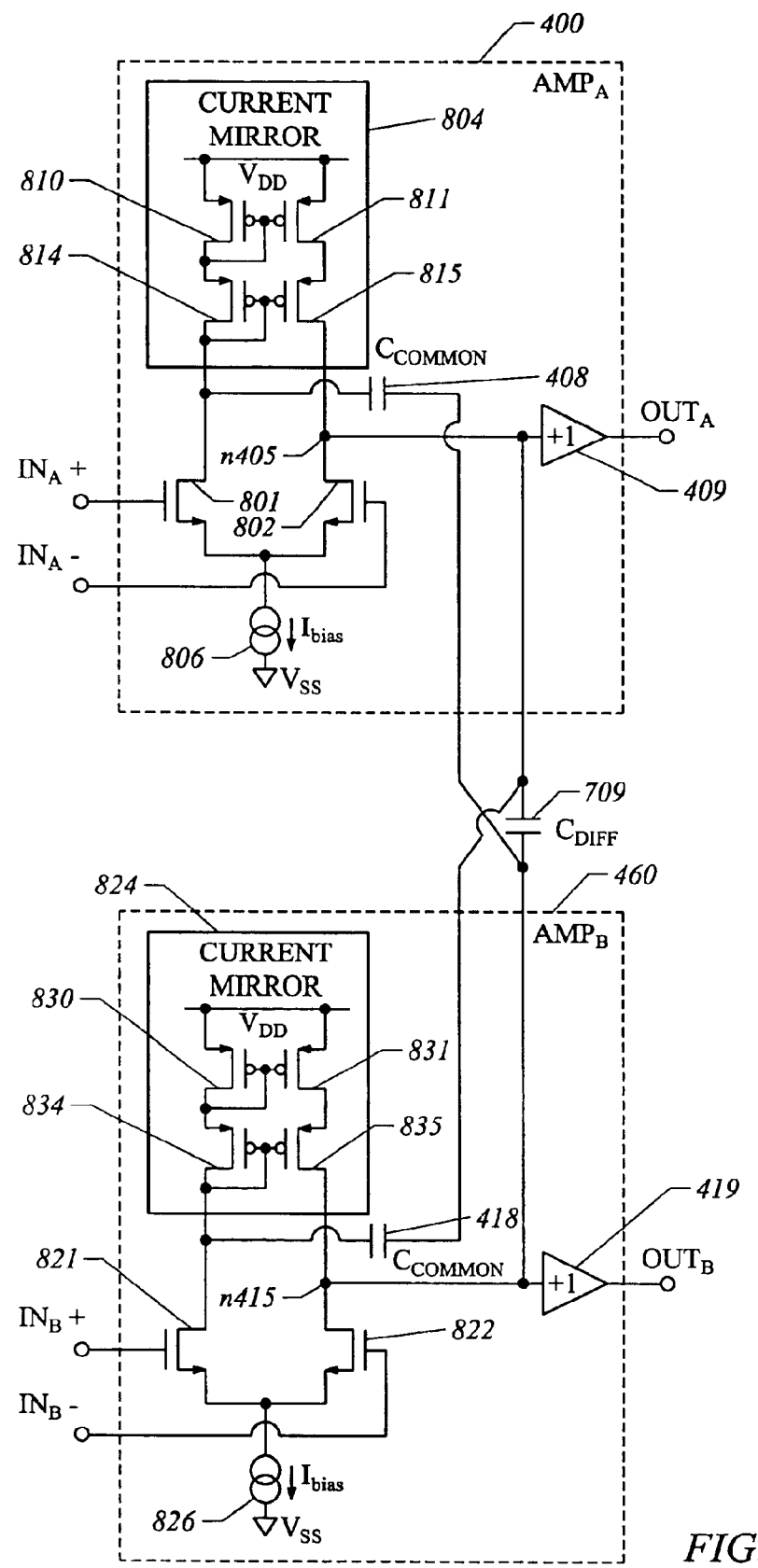
FIG. 8 shows the two amplifiers of FIG. 4 created using MOSFET voltage-feedback differential amplifiers, according to an embodiment of the present invention.

FIG. 8 shows amplifiers AMP$_A$ 400 and AMP$_B$ 460 of FIG. 4 created using MOSFET voltage-feedback differential amplifiers. The amplifier AMP$_A$ 400 includes differentially connected NMOS transistors 801 and 802, each with a gate forming a respective input of the amplifier 400, and sources connected together through a current sink 806 to V$_{SS}$. A current mirror 804 has terminals connected to the respective drains of the transistors 801 and 802. The drain of transistor 802 is also connected through buffer 409 to form the output OUT$_A$. The drain of transistor 801 is further connected to a first terminal of the common mode compensation capacitor 408 having a value C$_{COMMON}$.

Similar to the AMP$_A$ 400, the amplifier AMP$_B$ 460 includes differentially connected NMOS transistors 821 and 822, each with a gate forming a respective input of the amplifier AMP$_B$ 460, and sources connected together through a current sink 826 to V$_{SS}$. A current mirror 824 has terminals connected to the respective drains of the transistors 821 and 824. The drain of transistor 821 is connected through buffer 419 to form the output OUT$_B$. The drain of 821 is connected to a first terminal of a common mode compensation capacitor 418 having a value C$_{COMMON}$.

The current mirror 804 of AMP$_A$ 400 includes two PMOS transistors 810 and 811 connected with common gates, and sources connected to the power supply rail V$_{DD}$. A second set of PMOS transistors 814 and 815 are also connected with common gates. The drains of transistors 814 and 815 form the input and output terminals of the current mirror 804. The drain and gate of transistor 810 is connected to the source of transistor 814. The drain of transistor 811 is connected to the source of transistor 815. The gate of transistor 814 is connected to its drain.

The current mirror 824 of $AMP_B$ 460 includes transistors 830, 831, 834 and 835 connected in a manner similar to the connection of transistors 810, 811, 814 and 815 of $AMP_A$ 400. The transistors 814, 815, 834 and 835 serve to isolate the outputs $OUT_A$ and $OUT_B$ from variations in the power supply voltage $V_{DD}$. Although one configuration of transistors forming a current mirror is shown for current mirrors 804 and 824, other configurations might be used, such as eliminating transistors 814, 815, 834 and 835 and using the drains of transistors 810, 811, 830 and 831 as terminals of the current mirrors 804 and 824.

A compensation scheme similar to FIG. 7, with independent common mode and differential mode compensation is used in FIG. 8. As in FIG. 7, a differential mode compensation capacitor 709 having a value $C_{DIFF}$ is connected between the gain nodes n405 and n415 of the amplifiers $AMP_A$ 400 and $AMP_B$ 460. A second terminal of the common mode compensation capacitors 418 and 408, each having a value $C_{COMMON}$, is connected to a respective gain node terminals n405 and n415.

Figure 9:
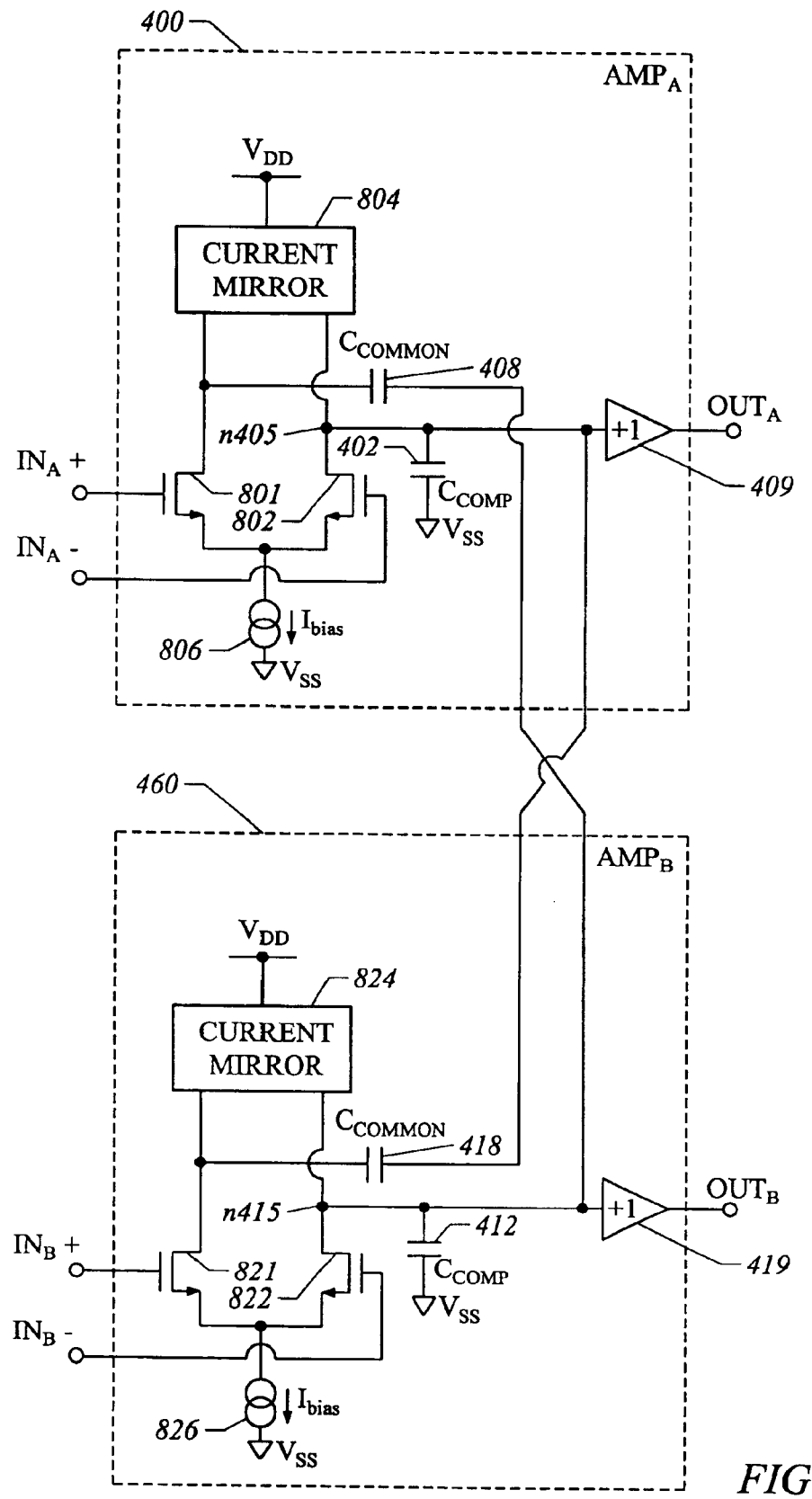
FIG. 9 shows modifications to the circuit of FIG. 8 to provide differential mode compensation as in the circuits of FIGS. 4 and 5, according to an embodiment of the present invention.
Figure 10:
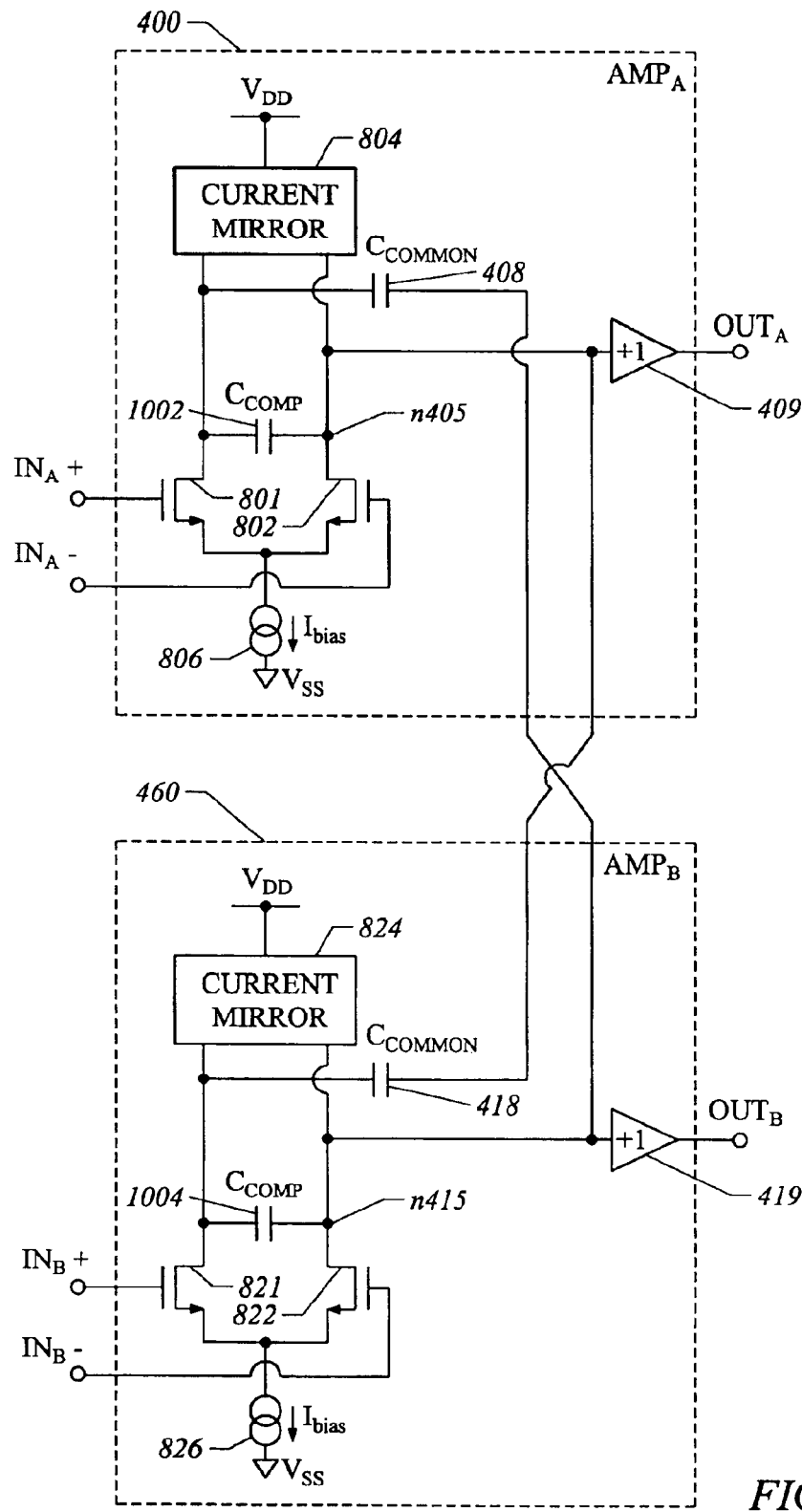
FIG. 10 shows modifications to the circuit of FIG. 8 to provide differential mode compensation along with Miller effect compensation, according to an embodiment of the present invention.

Although FIG. 8 shows one configuration for providing compensation for both differential and common mode signals, other configurations are available in accordance with the present invention. FIGS. 9 and 10 show alternative configurations to FIG. 8 for providing differential mode compensation with amplifiers $AMP_A$ 400 and $AMP_B$ 460 still using MOSFET differential amplifiers.

FIG. 9 shows modifications to the circuit of FIG. 8 to provide single-ended compensation, as in the circuits of FIGS. 4 and 5. The differential mode capacitor 709 of FIG. 8 having a capacitance value $C_{DIFF}$ is removed, and differential mode compensation capacitors 402 and 412, each having a value $C_{COMP}$ are used. Capacitor 402 is connected from the gain node n405 to $V_{SS}$, while the capacitor 412 is connected from the gain node n415 to $V_{SS}$.

FIG. 10 shows modifications to the circuit of FIG. 8 to provide differential mode compensation similar to the circuit of FIG. 6. In FIG. 10, the differential mode capacitor 709 from FIG. 8 is removed and differential mode capacitors 1002 and 1004, each having a value $C_{COMP}$ are used. Capacitor 1002 is connected from node n405 to the drain of transistor 801, while the capacitor 1004 is connected from the gain node n415 to the drain of transistor 821. The capacitors 1002 and 1004 differ from the configuration of FIG. 9 in that Miller effect compensation is provided. Although the configurations of FIG. 9 and FIG. 10 offer alternatives to FIG. 8, they do not provide independent common mode and differential mode compensation, since the capacitors having a value $C_{COMP}$ used in FIGS. 9 and 10 provide some common mode compensation, as well as differential mode compensation.

Although the present invention has been described above with particularity, this was merely to teach one of ordinary skill in the art how to make and use the invention. Many other modifications will fall within the scope of the invention, as that scope is defined by the claims provided to follow.

What is claimed is:

1. An amplifier circuit comprising:
   two operational amplifiers, each operational amplifier comprising:
      a transconductance stage, having an inverting input, a non-inverting input, and having an output forming a gain node; and
      a buffer connecting the gain node to an output of the operational amplifier;
      an inverter having an input connected to the gain node, and having an output;
   a first compensation capacitor connecting the output of the inverter of a first of the two operational amplifiers to the input of the inverter of a second of the two operational amplifiers; and
   a second compensation capacitor connecting the output of the inverter of the second of the two operational amplifiers to the input of the inverter of the first of the two operational amplifiers.

2. The amplifier circuit of claim 1, further comprising:
   a third compensation capacitor connecting the gain node of the first of the two operational amplifiers to a first power supply potential; and
   a fourth compensation capacitor connecting the gain node of the second of the two operational amplifiers to the first power supply potential.

3. The amplifier circuit of claim 1, further comprising:
   a third compensation capacitor connecting the gain node of the first of the two operational amplifiers to the gain node of the second of the two operational amplifiers.

4. An amplifier circuit comprising:
   two current feedback amplifiers, each current feedback amplifier comprising:
      a first transistor (501,551) having a base forming a non-inverting input ($IN_A$+,$IN_B$+), a collector connected to a first power supply potential (Vcc), and having an emitter;
      a first current sink (506,556) connecting the emitter of the first transistor to a second power supply potential (Vee);
      a second transistor (502,552) having a base connected to the based of the first transistor (501,551), a collector connected to the second power supply potential (Vee), and having an emitter;
      a second current sink (508,558) connecting the emitter of the second transistor (502,552) to the first power supply potential (Vcc);
      a third transistor (503,553) having a base connected to the emitter of the second transistor (502,552), an emitter forming an inverting input ($IN_A$-,$IN_B$-), and a collector;
      a fourth transistor (504,554) having a base connected to the emitter of the first transistor (501,551), an emitter connected to the emitter of the third transistor (503, 553), and having a collector;
      a first current mirror (510,560) having an input terminal connected to the collector of the third transistor (503,553), and having an output terminal;
      a second current mirror (512,562) having an input terminal connected to the collector of the fourth transistor (504,554), and having an output terminal connected to the output terminal of the first current mirror (510,560) forming a gain node (n405,n415); and
      a buffer (409,419) having an input connected to the gain node (n405,n415) and an output forming an output ($OUT_A$,$OUT_B$) of the current feedback amplifier;
   a first common mode compensation capacitor (514) having a first terminal connected to the input terminal of the first current mirror (510) of a first one of the two current feedback amplifiers ($AMP_A$ 400), and a second terminal connected to the gain node (n415) of a second one of the two current feedback amplifiers ($AMP_B$ 460);

a second common mode compensation capacitor (516) having a first terminal connected to the input terminal of the second current mirror (512) of the first one of the two current feedback amplifiers (AMP$_A$ 400), and a second terminal connected to the gain node (n415) of the second one of the two current feedback amplifiers (AMP$_B$ 460);

a third common mode compensation capacitor (564) having a first terminal connected to the input terminal of the first current mirror (560) of the second one of the two current feedback amplifiers (AMP$_B$ 460), and a second terminal connected to the gain node (n405) of the first one of the two current feedback amplifiers (AMP$_A$ 400); and a fourth common mode compensation capacitor (566) having a first terminal connected to the input terminal of the second current mirror (562) of the second one of the two current feedback amplifiers (AMP$_B$ 460), and a second terminal connected to the gain node (n405) of the first one of the two current feedback amplifiers (AMP$_A$ 400).

5. The amplifier circuit of claim 4, further comprising:
a first differential mode compensation capacitor (402) connecting the gain node of the first of the two current feedback amplifiers (AMP$_A$ 400) to the second power supply potential (Vee); and
a second differential mode compensation capacitor (412) connecting the gain node of the second of the two current feedback amplifiers (AMP$_B$ 460) to the second power supply potential (Vee).

6. The amplifier circuit of claim 4, further comprising:
a first differential mode compensation capacitor (601) connecting the gain node to the input terminal of the first current mirror (510) of the first of the two current feedback amplifiers (AMP$_A$ 400);
a second differential mode compensation capacitor (602) connecting the gain node to the input terminal of the second current mirror (512) of the first of the two current feedback amplifiers (AMP$_A$ 400);
a third differential mode compensation capacitor (604) connecting the gain node to the input terminal of the first current mirror (560) of the second of the two current feedback amplifiers (AMP$_B$ 460); and
a fourth differential mode compensation capacitor (606) connecting the gain node to the input terminal of the second current mirror (562) of the second of the two current feedback amplifiers (AMP$_B$ 460).

7. The amplifier circuit of claim 4, further comprising:
a differential mode compensation capacitor (709) connecting the gain node of the first of the two current feedback amplifiers (AMP$_A$ 400) to the gain node of the second of the two current feedback amplifiers (AMP$_B$ 460).

8. An amplifier circuit comprising:
two differential amplifiers, each differential amplifier comprising:

a first transistor (801,821) having a gate forming a non-inverting input (IN$_A$+,IN$_B$+), and having a source and a drain;

a second transistor (802, 822) having a gate forming an inverting input (IN$_A$−,IN$_B$−), and having a source connected to the source of the first transistor (801, 821), and having a drain forming an inverting output gain node (n405, n415);

a current sink (806,826) connecting the source of the first and second transistors to a first power supply potential (V$_{SS}$);

a current mirror (804,824) having an input terminal connected to the drain of the first transistor (801, 821), and an output terminal connected to the gain node (n405,n415);

a buffer (409,419) having an input connected to the gain node (n405,n415) and an output forming an output (OUT$_A$,OUT$_B$) of the differential amplifier;

a first common mode compensation capacitor (408) having a first terminal connected to the input terminal of the current mirror (804) of a first one of the two differential amplifiers (AMP$_A$ 400), and a second terminal connected to the gain node (n415) of a second one of the two differential amplifiers (AMP$_B$ 460); and a second common mode compensation capacitor (418) having a first terminal connected to the input terminal of the current mirror (824) of the second one of the two differential amplifiers (AMP$_B$ 460), and a second terminal connected to the gain node (n405) of the first one of the two current feedback amplifiers (AMP$_A$ 400).

9. The amplifier circuit of claim 8, further comprising:
a first differential mode compensation capacitor (402) connecting the gain node of the first of the two differential amplifiers (AMP$_A$ 400) to the first power supply potential (Vss); and
a second differential mode compensation capacitor (412) connecting the gain node of the second of the two differential amplifiers (AMP$_B$ 460) to the first power supply potential (Vss).

10. The amplifier circuit of claim 8, further comprising:
a first differential mode compensation capacitor (1002) connecting the gain node (n405) to the drain of the first transistor (801) in the first of the two differential amplifiers (AMP$_A$ 400); and
a second differential mode compensation capacitor (1004) connecting the gain node (n415) to the drain of the first transistor (821) in the second of the two differential amplifiers (AMP$_B$ 460).

11. The amplifier circuit of claim 8, further comprising:
a differential mode compensation capacitor (709) connecting the gain node of the first of the two differential amplifiers (AMP$_A$ 400) to the gain node of the second of the two differential amplifiers (AMP$_B$ 460).

* * * * *